United States Patent
Abe

(10) Patent No.: US 10,330,707 B2
(45) Date of Patent: Jun. 25, 2019

(54) CURRENT SENSOR HAVING CONDUCTOR BETWEEN PAIR OF PLATE-LIKE MAGNETIC SHIELDS

(71) Applicant: Alps Alpine Co., Ltd., Tokyo (JP)

(72) Inventor: Minoru Abe, Miyagi-ken (JP)

(73) Assignee: Alps Alpine Co., Ltd., Tokyo (JP)

( * ) Notice: Subject to any disclaimer, the term of this patent is extended or adjusted under 35 U.S.C. 154(b) by 48 days.

(21) Appl. No.: 15/674,378

(22) Filed: Aug. 10, 2017

(65) Prior Publication Data

US 2017/0343584 A1 Nov. 30, 2017

Related U.S. Application Data

(63) Continuation of application No. PCT/JP2016/057605, filed on Mar. 10, 2016.

(30) Foreign Application Priority Data

Mar. 17, 2015 (JP) ................. 2015-053847

(51) Int. Cl.
*G01R 15/18* (2006.01)
*G01R 15/14* (2006.01)
*G01R 15/20* (2006.01)

(52) U.S. Cl.
CPC ......... *G01R 15/148* (2013.01); *G01R 15/205* (2013.01)

(58) Field of Classification Search
CPC G01R 19/0092; G01R 15/202; G01R 15/205; G01R 15/185; G01R 33/093; G01R 35/005; G01R 15/181; G01R 33/0023; G01R 33/09; G01R 15/183; G01R 15/247; G01R 33/07; G01R 31/343; G01R 33/02; G01R 19/25; G01R 19/2513; G01R 1/04; G01R 31/40; G01R 33/0041; G01R 33/035; G01R 3/00; G01R 11/04; G01R 15/18; G01R 19/10; G01R 19/2506; G01R 1/00;
(Continued)

(56) References Cited

U.S. PATENT DOCUMENTS

| | | | |
|---|---|---|---|
| 5,561,366 A * | 10/1996 | Takahashi | G01R 15/205 324/117 R |
| 9,417,269 B2 * | 8/2016 | Sakai | G01R 15/205 |
| 10,088,505 B2 * | 10/2018 | Okuyama | G01R 15/205 |

FOREIGN PATENT DOCUMENTS

| | | |
|---|---|---|
| JP | 4515855 B2 | 5/2010 |
| JP | 2013-044705 A | 3/2013 |
| JP | 2013-246005 A | 12/2013 |

OTHER PUBLICATIONS

International Search Report dated May 31, 2016 from International Application No. PCT/JP2016/057605.

\* cited by examiner

*Primary Examiner* — Vinh P Nguyen

(74) *Attorney, Agent, or Firm* — Beyer Law Group LLP

(57) ABSTRACT

Each of three magnetic sensors is positioned on a first virtual line that passes the centers of two magnetic shields in the width direction and is perpendicular to a virtual plane, so a value detected by the magnetic sensor is less likely to be influenced by an external magnetic field. The first virtual line and the center of a conductor intersecting the first virtual line are separated from each other by a certain distance. Therefore, even if a distance from the center of the conductor in the width direction to the magnetic sensor is short, it is possible to improve, on a high-frequency side, frequency characteristics in the detection sensitivity of the magnetic sensor for the frequency of the current under measurement.

8 Claims, 4 Drawing Sheets

(58) Field of Classification Search
CPC ...... G01R 1/06788; G01R 1/30; G01R 21/00; G01R 21/06; G01R 33/0017; G01R 33/075; G01R 35/02; G01R 15/186; G01R 21/00; G01D 11/24
See application file for complete search history.

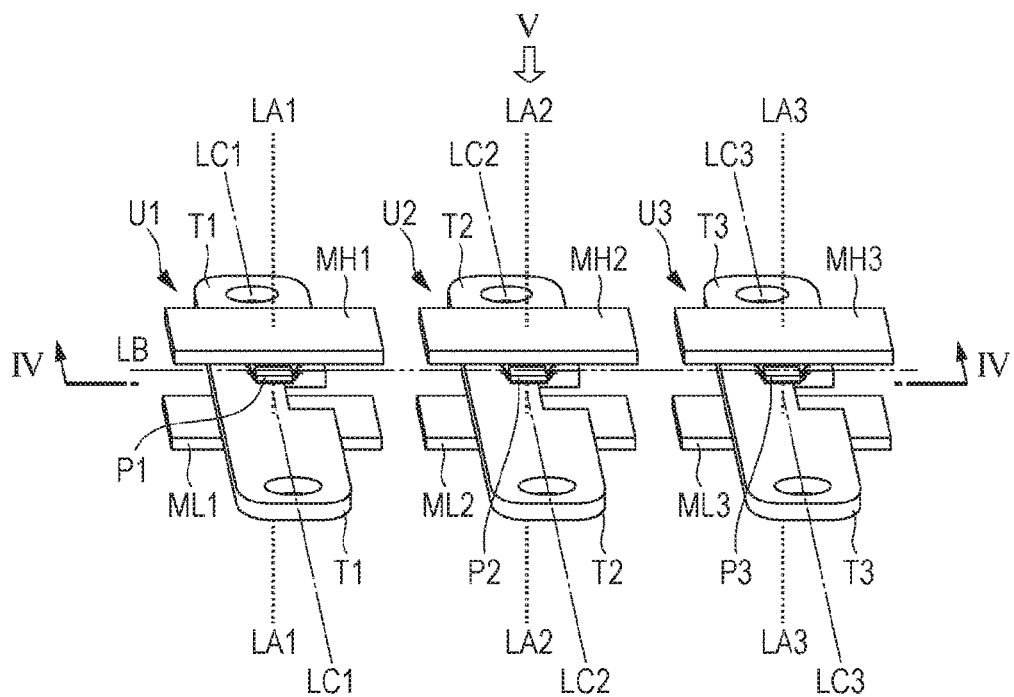
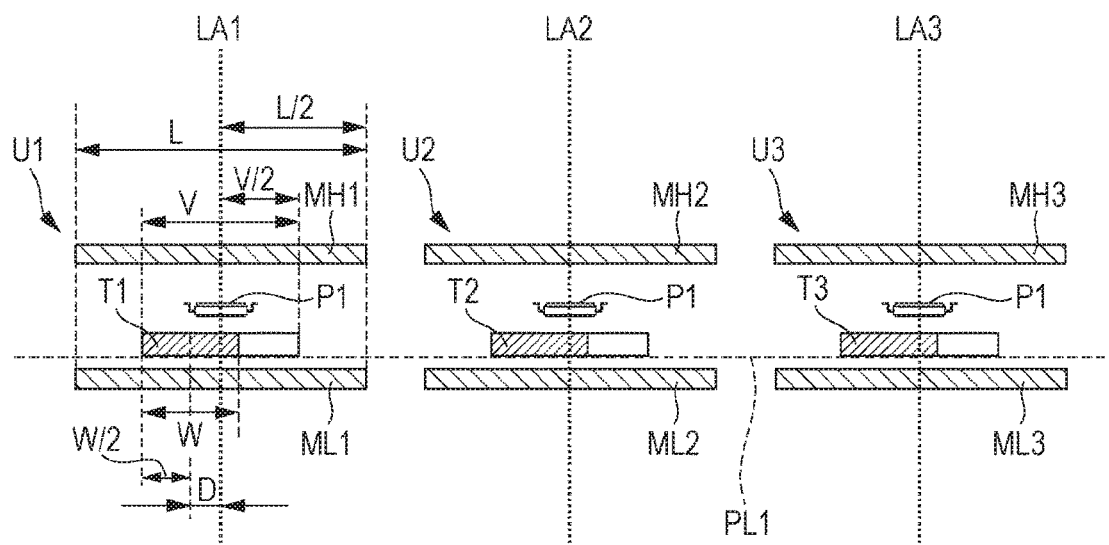

CURRENT SENSOR HAVING CONDUCTOR BETWEEN PAIR OF PLATE-LIKE MAGNETIC SHIELDS

CLAIM OF PRIORITY

This application is a Continuation of International Application No. PCT/JP2016/057605 filed on Mar. 10, 2016, which claims benefit of Japanese Patent Application No. 2015-053847 filed on Mar. 17, 2015. The entire contents of each application noted above are hereby incorporated by reference.

BACKGROUND OF THE INVENTION

1. Field of the Invention

The present invention relates to a current sensor that uses magnetic sensors to detect currents, and more particularly to a current sensor that detects currents flowing in a plurality of adjacent conductors.

2. Description of the Related Art

A generally known current sensor is structured so that a magnetic sensor (such as a magnetoresistance effect element) that can be mounted on a circuit board as a chip part is placed in the vicinity of a conductor in which a current to be detected flows and the intensity of a magnetic field detected by the magnetic sensor is output as the detected value of the current.

When this type of current sensor is used to measure a current flowing in a plate-like conductor having a wide width, a magnetic sensor is generally disposed near the center of the conductor in the width direction. At a high frequency, however, a current flows so as to concentrate near the edges of the conductor due to a skin effect. Therefore, it is known that if the magnetic sensor is placed near the center in the width direction, the detection sensitivity of the magnetic sensor is lowered. In this case, if the frequency of the current under measurement is increased beyond a certain degree, the level of a detection signal is lowered even in a frequency band in which the magnetic sensor itself can be used. That is, the frequency band in which a current can be measured is narrowed when compared with the original performance of the magnetic sensor.

Japanese Patent No. 4515855 describes a current measurement method that improves the above problem with frequency characteristics by placing a magnetic sensor at a predetermined distance from the central position of a flat-shaped conductor to be measured in the width direction.

SUMMARY OF THE INVENTION

The above problem with frequency characteristics also arises when, for example, a multi-channel current sensor is used to detect each of currents flowing in a plurality of adjacent plate-like conductors by using a magnetic sensor. In this case, however, if the magnetic sensor is simply moved to an edge of the plate-like conductor by a method as described in Japanese Patent No. 4515855, the magnetic sensor comes close to an adjacent plate-like conductor, so the magnetic sensor is easily influenced by an external magnetic field generated by a current flowing in the adjacent plate-like conductor. This causes another problem that measurement error becomes large. An example of a possible solution to this problem is to widen the spacing between plate-like conductors. In this method, however, the size of the entire current sensor is enlarged. Another possible solution is to narrow the width of the plate-like conductor to essentially widen the spacing between plate-like conductors. In this method, however, the cross-sectional area of the plate-like conductor is reduced and a resistance loss is thereby increased, limiting the maximum current rating.

The present invention addresses the above situations by providing a current sensor that can suppress measurement error due to the influence of a current flowing in a conductor adjacent to another conductor in which a current under measurement flows and can also widen the frequency band in which a current can be measured.

A current sensor according to the present invention includes a plurality of plate-like conductors, each of which has a plate surface positioned in the same virtual plane, the plate-like conductors being aligned and extending in parallel to one another, and also includes a plurality of current detectors, each of which detects a current flowing in one of the plurality of conductors. The current detector has two plate-like magnetic shields, each of which has a plate surface parallel to the virtual plane, the two magnetic shields facing each other with the conductor intervening therebetween, and also has a magnetic sensor positioned between the two magnetic shields. The two magnetic shields have the same length in a width direction parallel to the virtual plane and perpendicular to a length direction of the conductor. The magnetic sensor is positioned on a first virtual line that passes the centers of the two magnetic shields in the width direction and is perpendicular to the virtual plane. The conductor has a first conductor part that is positioned between the two magnetic shields and intersects the first virtual line. The first virtual line and the center of the first conductor part in the width direction are separated from each other.

In the above structure, since the magnetic sensor is positioned between the two magnetic shields, due to the magnetic shield effect of the two magnetic shields, a value detected by the magnetic sensor included in one current detector is less likely to be influenced by an external magnetic field generated by a current flowing in another conductor.

In addition, the magnetic sensor is positioned on the first virtual line that passes the centers of the two magnetic shields in the width direction and is perpendicular to the virtual plane. Therefore, it is possible to further reduce the influence of the external magnetic field when compared with a case in which the magnetic sensor is positioned along edges of the two magnetic shields in the width direction, so error in current measurement can be effectively suppressed.

In the above structure, there is a space between the first virtual line on which the magnetic sensor is positioned and the center of the first conductor part in the width direction, the first conductor part intersecting the first virtual line. Therefore, it is possible to improve, on a high-frequency side, frequency characteristics in the detection sensitivity of the magnetic sensor for the frequency of the current under measurement when compared with a case in which the center of the first conductor part in the width direction is placed close to the first virtual line. Therefore, it is possible to widen the frequency band in which a current can be measured.

Preferably, when the length of the first conductor part in the width direction is W, the length L of the magnetic shield in the width direction may be at least 2×W and at most 5×W. In this case, a distance D in the width direction by which the first virtual line and the center of the first conductor part in the width direction are separated from each other may be larger than $(W/2) \times (16/32)$ and smaller than $(W/2) \times (20/32)$.

In the above structure, it is possible to obtain an effect of improving the frequency characteristics due to a space between the first virtual line and the center of the first conductor part in the width direction, without the effect of suppressing the external magnetic field being hindered, the effect being provided by the magnetic shield effect of the two magnetic shields.

Preferably, when the length of the first conductor part in the width direction is W, the length L of the magnetic shield in the width direction may be at least $2 \times W$ and at most $5 \times W$. In this case, a distance D in the width direction by which the first virtual line and the center of the first conductor part in the width direction are separated from each other may be larger than $(W/2) \times (17/32)$ and smaller than $(W/2) \times (19/32)$.

In the above structure, it is possible to obtain the fullest effect of improving the frequency characteristics due to a space between the first virtual line and the center of the first conductor part in the width direction, without the effect of suppressing the external magnetic field being hindered, the effect being provided by the magnetic shield effect of the two magnetic shields.

Preferably, the plurality of magnetic sensors, each of which is included in one of the plurality of current detectors, may be positioned on a second virtual line parallel to the virtual plane and also parallel to the width direction. In this case, the above current sensor may have a circuit board on which the plurality of magnetic sensors are mounted in common.

Therefore, the number of parts used to mount the plurality of magnetic sensors is reduced, enabling the structure to be simplified.

Preferably, the conductor may have second conductor parts, each of which is formed so as to extend, in parallel to the length direction, from one of both ends of the first conductor part in the length direction. The length of the second conductor part in the width direction may be longer than the length of the first conductor part in the width direction.

Therefore, a resistance loss in the conductor can be made smaller than when the length in the width direction across the conductor is the same as the length of the first conductor part in the width direction.

Preferably, the current sensor may have three or more equally spaced conductors. In this case, a third virtual line and the first virtual line may intersect, the third virtual line passing the center, in the width direction, of each second conductor part included in one conductor disposed between two conductors, the third virtual line being parallel to the virtual plane, the first virtual line being in the current detector provided in correspondence to the one conductor.

In the above structure, since three or more conductors are equally spaced, first virtual lines in three or more current detectors provided in correspondence to the three or more conductors are also equally spaced. Since the third virtual line in the second conductor part included in the one conductor and the first virtual line in the current detector provided in correspondence to the one conductor intersect, two first virtual lines, which correspond to the two conductors, are symmetrically positioned with respect to the third virtual line of the one conductor. Therefore, magnetic sensors, which are included in two current detectors provided in correspondence to the two conductors, are separated from the second conductor part included in the one conductor by the same distance. Accordingly, an external magnetic field generated by a current flowing in the second conductor part included in the one conductor influences values detected by the two magnetic sensors to the same extent. That is, the external magnetic field does not largely influence only one of the two magnetic sensors.

Preferably, one edge of the first conductor part in the width direction and one edge of the second conductor part in the width direction may be continuous to each other.

Therefore, if the adjacent distance between the conductors is shortened to a limit up to which the influence of the external magnetic field on values detected by the magnetic sensor can be ignored, the lengths of the first conductor part and second conductor part in the width direction are prolonged in the width direction. This enables resistance losses in the conductors to be reduced.

Preferably, the entire first conductor part may be positioned between the two magnetic shields.

Therefore, even if the length of the first conductor part in the length direction is relatively short, an even magnetic field can be easily generated in the magnetic sensor by a current flowing in the first conductor part. This enables positional precision required in the placement of the magnetic sensor to be relaxed. As the length of the first conductor part is shortened, the ratio of the second conductor part to the conductor is increased. This can further reduce the resistance loss in the conductor.

The present invention can suppress measurement error due to the influence of a current flowing in a conductor adjacent to another conductor in which a current under measurement flows and can also widen the frequency band in which a current can be measured with small measurement error.

BRIEF DESCRIPTION OF THE DRAWINGS

FIG. 3 illustrates the internal structure of the current sensor illustrated in FIG. 1 with the circuit board and terminal omitted;

FIG. 4 is a cross-sectional view of the internal structure of the current sensor illustrated in FIG. 3, as taken along line IV-IV;

DESCRIPTION OF THE PREFERRED EMBODIMENT

A current sensor according to an embodiment of the present invention will be described with reference to the drawings.

Figure 1:
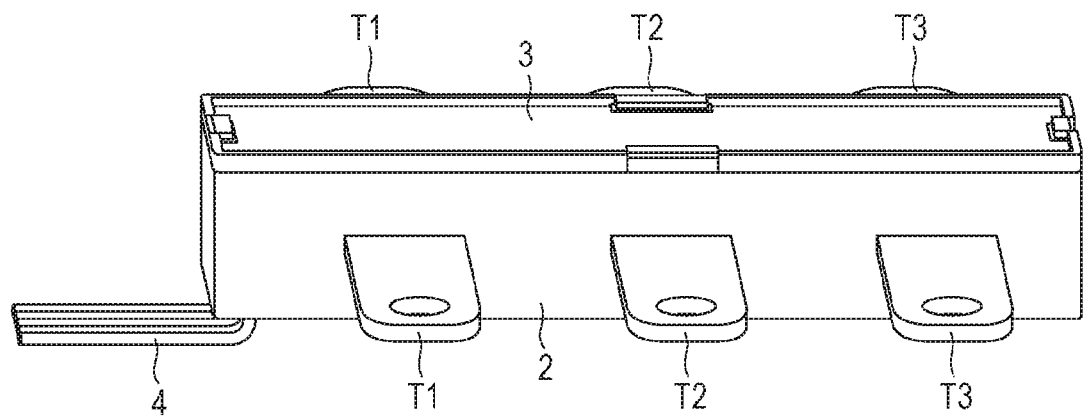
FIG. 1 illustrates an example of the outside shape of a current sensor according to an embodiment of the present invention.
Figure 2:
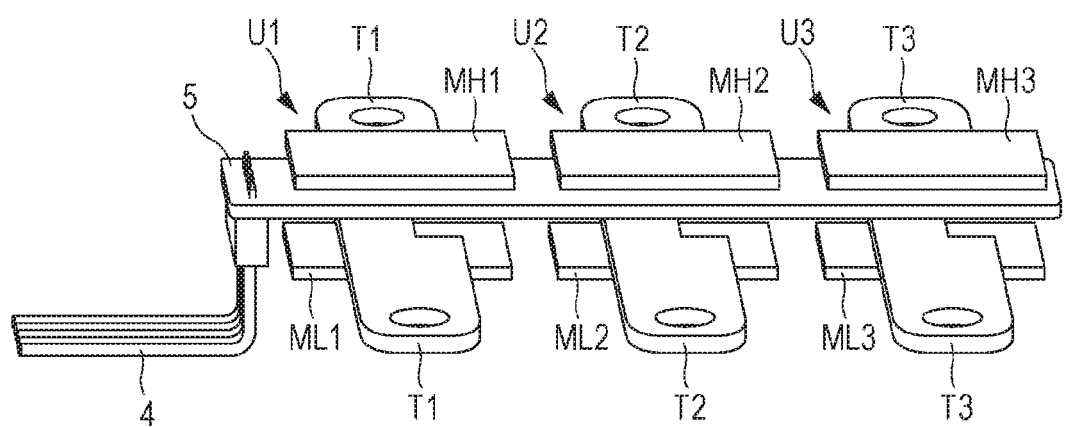
FIG. 2 illustrates an example of the internal structure of the current sensor illustrated in FIG. 1 with the cases omitted.
Figure 5:
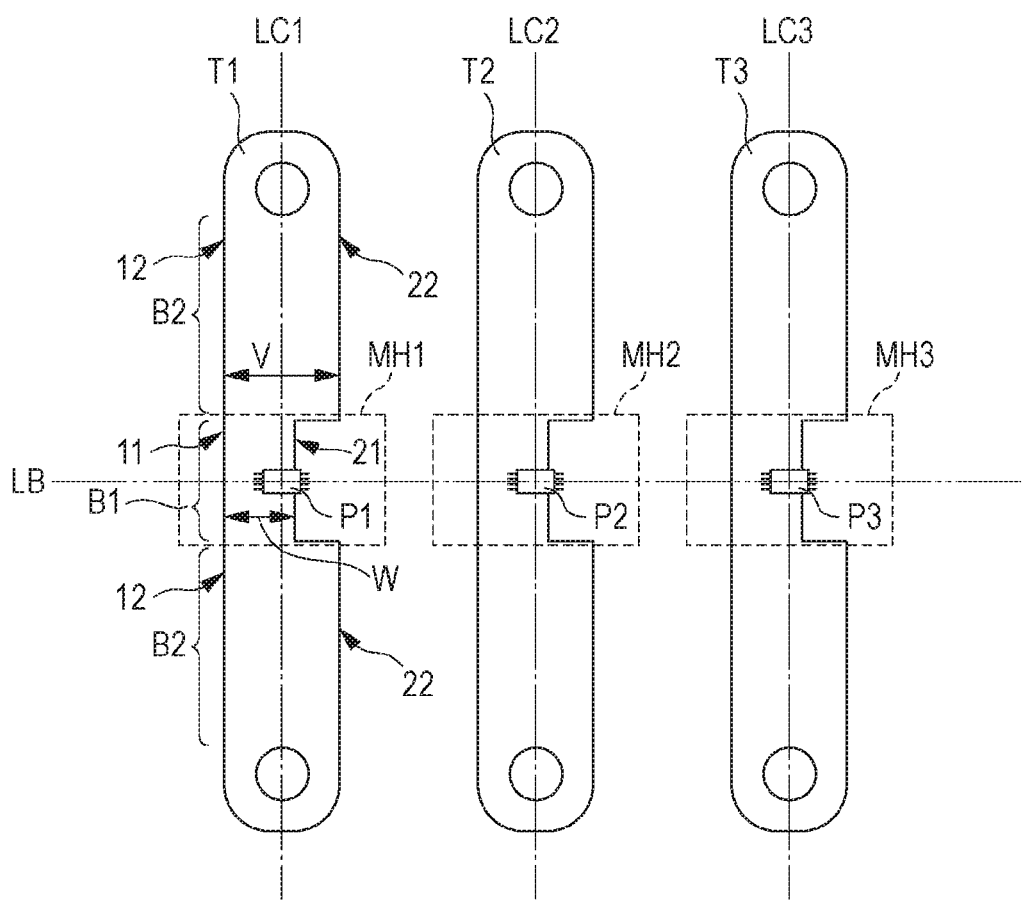
FIG. 5 illustrates the internal structure of the current sensor illustrated in FIG. 3, as viewed in the direction indicated by arrow V.

FIG. 1 illustrates an example of the outside shape of the current sensor according to this embodiment. FIG. 2 illustrates an example of the internal structure of the current sensor illustrated in FIG. 1 with the cases 2 and 3 omitted. FIG. 3 illustrates the internal structure of the current sensor illustrated in FIG. 1 with the circuit board 5 and terminal 4 omitted. FIG. 4 is a cross-sectional view of the internal structure of the current sensor illustrated in FIG. 3, as taken along line IV-IV. FIG. 5 illustrates the internal structure of the current sensor illustrated in FIG. 3, as viewed in the direction indicated by arrow V; the magnetic shields (MH1 to MH3) that would otherwise appear in front as viewed in that direction are omitted.

The current sensor in the examples in the drawings referenced above is a three-channel current sensor that can independently measure currents flowing in three current paths. The current sensor has three conductors T1 to T3, each of which forms a current path, and three current detectors U1 to U3, which detect currents flowing in the conductors T1 to T3, respectively.

The conductors T1 to T3 are each an elongated plate-like conductor. They have plate surfaces positioned in the same virtual plane PL1. That is, the conductors T1 to T3 are placed so that their plate surfaces are flush with the virtual plane PL1. The conductors T1 to T3 extend in parallel to one another and are aligned in the virtual plane PL1. In the examples in the drawings referenced above, the conductors T1 to T3 are equally spaced.

In the drawings referenced above, the conductors T1 to T3 have equivalent shapes. Specifically, the conductors T1 to T3 have the same length in a direction in which they extend (sometimes, the direction will be simply referred to below as the length direction), the same length in a direction perpendicular to the length direction and parallel to the virtual plane PL1 (sometimes, the direction will be simply referred to below as the width direction), and the same thickness perpendicular to the virtual plane PL1. The conductors T1 to T3 each have holes at both ends, one at each end; each hole is used to attach, for example, a terminal for connection.

A current detector Ui (i is an integer from 1 to 3) is a block that detects a current flowing in a conductor Ti. The current detector Ui has two magnetic shields MHi and MLi and a magnetic sensor Pi. Specifically, a current detector U1 has two magnetic shields MH1 and ML1 and a magnetic sensor P1, a current detector U2 has two magnetic shields MH2 and ML2 and a magnetic sensor P2, and a current detector U3 has two magnetic shields MH3 and ML3 and a magnetic sensor P3.

The two magnetic shields MHi and MLi included in the current detector Ui are each a plate-like member having a plate surface parallel to the virtual plane PL1. They are formed from a ferromagnetic substance. The magnetic shields MHi and MLi are positioned so as to face each other with the conductor Ti intervening therebetween. Their lengths in the width direction are equal. In the drawings referenced above, the magnetic shields MHi and MLi have the same rectangular shape having an edge extending in the width direction and another edge extending in the length direction; their edges in the width direction have the same length and their edge in the length direction also have the same length. The magnetic shields MHi and MLi are positioned so as to be symmetric with respect to the virtual plane PL1.

The magnetic sensor Pi is a sensor that detects a magnetic field corresponding to a current flowing in the conductor Ti. The magnetic sensor Pi is formed from, for example, a magnetoresistance effect element (such as a giant magneto resistive (GMR) device). The magnetic sensor Pi is positioned between the two magnetic shields MHi and MLi. That is, the magnetic sensor Pi is positioned on a first virtual line LAi that passes the centers of the magnetic shields MHi and MLi in the width direction and is perpendicular to the virtual plane PL1. In the drawings referenced above, this first virtual line LAi also passes the centers of the magnetic shields MHi and MLi in the length direction.

The three magnetic sensors P1 to P3 may be positioned on a second virtual line LB parallel to the virtual plane PL1 and also parallel to the width direction (see FIGS. 3 and 5). The current sensor according to this embodiment may have a circuit board 5 on which the three magnetic sensors P1 to P3 are mounted in common. The circuit board 5 has an elongated rectangular shape extending along the second virtual line LB. In the drawings referenced above, a terminal 4 used to connect a cable connector (not illustrated) or the like is attached to the circuit board 5.

As illustrated in FIG. 5, the conductors T1 to T3 each have a first conductor part B1 with a narrow width and second conductor parts B2 with a wide width, each of which is formed at one of both ends of the first conductor part B1. Each second conductor part B2 may be formed so as to extend, in parallel to the length direction, from one of both ends of the first conductor part B1 in the length direction. The length V of the second conductor part B2 in the width direction may be longer than the length W of the first conductor part B1 in the width direction (see FIG. 4).

The first conductor part B1 is positioned between the two magnetic shields MHi and MLi, and intersects the first virtual line LAi (see FIG. 4). In the example in FIG. 5, the entire first conductor part B1 is positioned between the two magnetic shields MHi and MLi. The magnetic sensor Pi positioned on the first virtual line LAi detects a magnetic field generated by a current flowing in the first conductor part B1.

As illustrated in FIG. 4, the center of the first conductor part B1 in the width direction may be spaced by a distance D from the first virtual line LAi, which intersects the first conductor part B1. To suppress the detection sensitivity of the magnetic sensor Pi from being changed depending on the frequency, this spaced distance D may be set so that it is larger than $(W/2) \times (16/32)$ and is smaller than $(W/2) \times (20/32)$. Preferably, the spaced distance D may be set so that it is larger than $(W/2) \times (17/32)$ and is smaller than $(W/2) \times (19/32)$. When the spaced distance D is set within this range, to assure the effect of suppressing an external magnetic field (mainly, a magnetic field generated by a current flowing in an adjacent conductor), the effect being provided by the magnetic shield effect of the two magnetic shields MHi and MLi, the length L of the magnetic shields MHi and MLi in the width direction may be set to, for example, at least $2 \times W$ and at most $5 \times W$.

As illustrated in FIG. 5, the center of each second conductor part B2 of the conductor Ti in the width direction is at the same position in the width direction (horizontal direction in FIG. 5) as the centers of the magnetic shields MHi and MLi in the width direction. That is, a third virtual line LCi and the first virtual line LAi intersect, the third virtual line LCi passing the center, in the width direction, of each second conductor part B2 of the conductor Ti, the third virtual line LCi being parallel to the virtual plane, the first virtual line LAi passing the centers of the magnetic shields MHi and MLi of the current detector Ui provided in correspondence to the conductor Ti (see FIG. 3). Since the center of each second conductor part B2 in the width direction matches the centers of the magnetic shields MH2 and ML2 in the width direction as described above, the conductor T2 positioned between the two conductors T1 and T3 provides a match between a spaced distance by which the magnetic sensor P1 is spaced from the second conductor part B2 and a spaced distance by which the magnetic sensor P3 is spaced from the second conductor part B2.

Furthermore, as illustrated in FIG. 5, one edge of the first conductor part B1 and one edge of each second conductor part B2 may be continuous to each other in the width direction. Specifically, one edge 11 of the first conductor part B1 and one edge 12 of each second conductor part B2 may be continuous to each other without a step. However, there is a step with a length of (V−W) between another edge 21 of the first conductor part B1 and another edge 22 of each second conductor part B2. If there is a margin in a space in which the current sensor is disposed, when the step is inclined, electromagnetic compatibility (EMC) can be enhanced.

The current sensor according to this embodiment has the cases 2 and 3 in which the current detectors U1 to U3 and circuit board 5 are accommodated, as illustrated in, for example, FIG. 1.

The case 3 is formed by being molded from a resin or the like so as to internally include the conductors T1 to T3 and magnetic shields ML1 to ML3. In the example in FIG. 1, the case 3 has an outside shape like a rectangular parallelepiped. The case 3 has an internal space in which the circuit board 5 is accommodated. The case 2 is formed by being molded from a resin or the like so as to internally include the magnetic shields MH1 to MH3. The case 2 is used as a lid that covers the space, described above, in the case 3.

Next, the frequency characteristics of the current sensor, according to this embodiment, structured as described above will be described with reference to FIG. 6.

Figure 6:
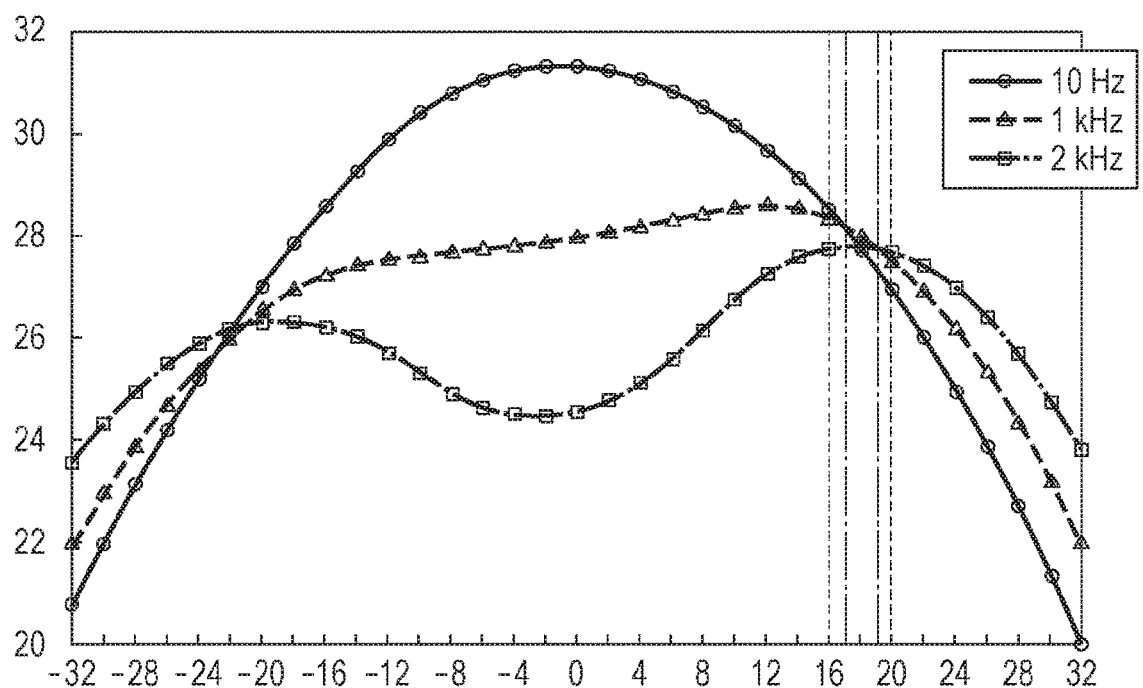
FIG. 6 illustrates magnetic flux density around a conductor in which a current flows.

FIG. 6 illustrates a magnetic flux density around a conductor in which a current flows in the structure in the present invention. The horizontal axis indicates the position of the first conductor part B1 in the width direction. Values on the horizontal axis have been normalized to match descriptions in Claims. The vertical axis indicates magnetic flux density. The results in FIG. 6 were obtained by a simulation performed under conditions described below. The conductor T2 at the center was measured. The length W of the first conductor part B1 in the width direction was 10.5 mm. The widths of the two magnetic shields were 25 mm. The centers of the two magnetic shields were shifted about 3 mm to the right from the center of the first conductor part B1. The value 0 on the horizontal axis indicates the center of the first conductor part B1. The value −32 on the horizontal axis indicates an edge of the first conductor part B1, the edge being on a side away from the centers of the two magnetic shields than the other edge. The value 32 on the horizontal axis indicates an edge of the first conductor part B1, the edge being on a side closer to the centers of the two magnetic shields than the other edge. In this embodiment, a value obtained by multiplying a value on the horizontal axis by 0.164 indicates a distance (spaced distance D) from the center of the first conductor part B1 in millimeters (mm). The positions of the centers of the two magnetic shields correspond to numeral 18 on the horizontal axis in FIG. 6.

FIG. 6 indicates that at a position at which the spaced distance D is larger than $(W/2)\times(16/32)$ and is smaller than $(W/2)\times(20/32)$, even if the frequency of a current changes, changes in magnetic flux density are small.

FIG. 6 further indicates that at a position at which the spaced distance D is larger than $(W/2)\times(17/32)$ and is smaller than $(W/2)\times(19/32)$, even if the frequency of a current changes, there are only extremely small changes in magnetic flux density.

Therefore, if the current sensor is designed so that the magnetic sensor P2 is placed at a position at which the spaced distance D is $(W/2)\times(18/32)$, it is possible to suppress changes in magnetic flux density even if the frequency of a current changes.

In the related art, described in Japanese Patent No. 4515855, in which two magnetic shields are not provided, there were only small changes in magnetic flux density in a range from a position at which the spaced distance D is $(W/2)\times(20/32)$ to a position at which the spaced distance D is $(W/2)\times(28/32)$. A comparison between the present invention and the related art indicates that the spaced distance D at a position at which changes in magnetic flux density in the present invention are small is shorter than in the related art.

When the spaced distance D is long, the distance between the adjacent conductor T3 and the magnetic sensor P2 becomes short, so the magnetic sensor P2 becomes likely to be influenced by an induced magnetic field generated by a current flowing in the adjacent conductor T3. That is, measurement precision is lowered. The spaced distance D in the present invention is shorter than in the related art, so a distance from the adjacent conductor T3 is long. This can suppress measurement precision from being lowered.

At a position at which the spaced distance D is larger than $(W/2)\times(16/32)$ and smaller than $(W/2)\times(20/32)$, magnetic flux density at a high frequency (2 kHz) is maximized. Thus, it is possible to suppress measurement precision at a high frequency from being lowered.

If it is enough only suppress changes in magnetic flux density with changes in the frequency of the current, FIG. 6 indicates that even a position at which the spaced distance D is about $(W/2)\times(-22/32)$ is sufficient. The negative sign of the spaced distance D indicates the leftward direction, that is, a direction away from the center of the two magnetic shields.

At a position at which the spaced distance D is about $(W/2)\times(-22/32)$, however, the absolute value of the spaced distance D is larger than the position described in the claims of the present invention, so measurement precision is easily influenced by an induced magnetic field generated by the adjacent conductor T1, lowering measurement precision. Furthermore, the magnetic flux density of the target under measurement is low. Therefore, in measurement at a position at which the spaced distance D is about $(W/2)\times(-22/32)$, precision is lowered.

From the results of many different simulations, it was found that at the position at which the spaced distance D is $(W/2)\times(18/32)$, the change in magnetic flux density is smallest. It was also found that when the magnetic sensor P2 is placed so as to match the centers of the two magnetic shields in the width direction, the influence of the external magnetic field is smallest. Thus, it was found that the best mode is to place the two magnetic shields so that their centers in the width direction match the position at which the spaced distance D is $(W/2)\times(18/32)$. In this description, therefore, results obtained by placing the two magnetic shields so that their centers in the width direction match the position at which the spaced distance D is $(W/2)\times(18/32)$ were described as simulation results in the best mode.

The current sensor according to this embodiment can provide the following effects.

The magnetic sensor Pi is positioned between the two magnetic shields MHi and MLi. Therefore, due to the magnetic shield effect of the two magnetic shields MHi and MLi, a value detected by the magnetic sensor Pi disposed for the conductor Ti is less likely to be influenced by an external magnetic field generated by a current flowing in another conductor adjacent to the conductor Ti.

The magnetic sensor Pi is positioned on the first virtual line LAi that passes the centers of the two magnetic shields MHi and MLi in the width direction and is perpendicular to the virtual plane PL1. Therefore, it is possible to further reduce the influence of the external magnetic field when compared with a case in which the magnetic sensor Pi is positioned along edges of the two magnetic shields MHi and MLi in the width direction, so error in current measurement can be effectively suppressed.

There is a space between the first virtual line LAi on which the magnetic sensor Pi is positioned and the center of the first conductor part B1 in the width direction, the first conductor part B1 intersecting the first virtual line LAi. Therefore, it is possible to improve, on a high-frequency side, frequency characteristics in the detection sensitivity of the magnetic sensor Pi for the frequency of the current under measurement when compared with a case in which the center of the first conductor part B1 in the width direction is placed close to the first virtual line LAi. Therefore, it is possible to widen the frequency band in which a current can be measured.

There is an offset between the first virtual line LAi passing the centers of the magnetic shields in the width direction and the center of the first conductor part B1 in the width direction. Therefore, even if an amount by which the magnetic sensor Pi is deviated from the center of the first conductor part B1 in the width direction is reduced, the frequency characteristics can be improved. By comparison, in the related art described in Japanese Patent No. 4515855, the spaced distance D has been needed to be set to at least $(W/2) \times (10/16)$. In the present invention, however, even if the setting of the spaced distance D is smaller than $(W/2) \times (10/16)$, the frequency characteristics can be improved. The shorter the spaced distance D is, the longer the distance from the adjacent conductor is. Therefore, even if downsizing is performed, the conductor Ti is less likely to be influenced by an external magnetic field generated by a current flowing in another conductor adjacent to the conductor Ti.

When the length of the first conductor part B1 in the width direction is W, the lengths L of the magnetic shields MHi and MLi in the width direction are set to at least $2 \times W$ and at most $5 \times W$, and the spaced distance D in the width direction between the first virtual line LAi and the center of the first conductor part B1 in the width direction is set within a range larger than $(W/2) \times (16/32)$ and smaller than $(W/2) \times (20/32)$. Therefore, it is possible to obtain an effect of improving the frequency characteristics due to a space between the first virtual line LAi and the center of the first conductor part B1 in the width direction, without the effect of suppressing an external magnetic field being hindered, the effect being provided by the magnetic shield effect of the two magnetic shields MHi and MLi.

The magnetic sensors P1 to P3 are positioned on the second virtual line LB parallel to the virtual plane PL1 and also parallel to the width direction, and are mounted on the circuit board 5 in common. Therefore, it is possible to reduce the number of parts, including the circuit board, used to mount the magnetic sensors P1 to P3, enabling the structure of a device to be simplified.

The second conductor parts B2, which are longer than the first conductor part B1 in the width direction, are formed at both ends of the first conductor part B1, one at each end. Therefore, a resistance loss in the conductor Ti can be made smaller than when the length in the width direction across the conductor Ti is the same as the narrow width of the first conductor part B1.

The conductors T1 to T3 are equally spaced. A third virtual line LC2 and a first virtual line LA2 intersect, the third virtual line LC2 passing the center, in the width direction, of each second conductor part B2 included in the conductor T2 disposed between the two conductors T1 and T3, the third virtual line LC2 being parallel to the virtual plane PL1, the first virtual line LA2 being in the current detector U2 provided in correspondence to the conductor T2.

Since the conductors T1 to T3 are equally spaced, the first virtual lines LA1 to LA3 in the current detectors U1 to U3 provided in correspondence to the conductors T1 to T3 are also equally spaced. Since the third virtual line LC2 in the second conductor part B2 included in the conductor T2 and the first virtual line LA2 in the current detector U2 provided in correspondence to the conductor T2 intersect, the two first virtual lines LA1 and LA3, which respectively correspond to the conductors T1 and T3, are symmetrically positioned with respect to the third virtual line LC2 of the conductor T2. Therefore, the magnetic sensors P1 and P3, which are respectively included in the two current detectors U1 and U3 provided in correspondence to the conductors T1 and T3, are separated from the second conductor part B2 included in the conductor T2 by the same distance. Accordingly, an external magnetic field generated by a current flowing in the second conductor part B2 included in the conductor T2 influences values detected by the magnetic sensors P1 and P3 to the same extent. That is, the external magnetic field does not largely influence only one of the magnetic sensors P1 and P3. Therefore, measurement error caused by the magnetic sensors P1 and P3 due to the influence of the external magnetic field can be reduced with good valance.

(9) One edge 11 of the first conductor part B1 in the width direction and one edge 12 of the second conductor part B2 in the width direction are continuous to each other without a step. Therefore, if the adjacent distance between the conductors T1 and T2 and the adjacent distance between the conductors T2 and T3 are shortened to a limit up to which the influence of the external magnetic field on values detected by the magnetic sensors P1 to P3 can be ignored, the lengths of the first conductor part B1 and second conductor part B2 in the width direction are not unnecessarily shortened by an amount equal to the step. That is, the lengths of the first conductor part B1 and second conductor part B2 are prolonged in the width direction. This enables a device to be made compact by shortening the adjacent distance between the conductors T1 and T2 and the adjacent distance between the conductors T2 and T3, and also enables resistance losses in the conductors T1 to T3 to be reduced.

(10) The entire first conductor part B1 is positioned between the two magnetic shields MHi and MLi. Therefore, even if the length of the first conductor part B1 in the length direction of the conductor Ti is relatively shortened, an even magnetic field can be easily generated in a magnetic sensor Pi by a current flowing in the first conductor part B1. This enables positional precision required in the placement of the magnetic sensor Pi to be relaxed. As the length of the first conductor part B1 with a narrow width is shortened, the ratio of the second conductor part B2 with a wide width to the conductor Ti is increased. This can further reduce the resistance loss in the conductor Ti. That is, resistance loss can be reduced by shortening the length of the first conductor part B1 in the length direction of the conductor Ti, and positional precision required in the placement of the magnetic sensor Pi can be relaxed.

The present invention is not limited to the embodiment described above. The present invention includes various variations.

Although, for example, a three-channel current sensor has been described as an example in the above embodiment, any number of channels measuring a current can be used. Furthermore, three-phase alternating currents or other mutually related currents may flow in the conductors, or mutually independent currents may flow in them.

What is claimed is:

1. A current sensor comprising:
    a plurality of plate-like conductors, each having a plate surface positioned in a same virtual plane, the plurality of conductors extending in a first direction and being aligned in parallel to one another; and
    a plurality of current detectors, each of which detects a current flowing through corresponding one of the plurality of conductors, each of the current detectors including:
        a pair of plate-like magnetic shields, each having a plate surface parallel to the virtual plane, the pair of magnetic shields facing each other with the corresponding conductor interposed therebetween, the pair of magnetic shields having a same length in a second direction perpendicular to the first direction, a first virtual line being defined for the pair of magnetic shields, the first virtual line being perpendicular to the virtual plane and passing through a center of each of the pair of magnetic shields with respect to the second direction; and
        a magnetic sensor provided between the pair of magnetic shields and positioned on the first virtual line,
    wherein each conductor has a first conductor portion positioned between the pair of magnetic shields such that the first virtual line intersects the first conductor portion, the first conductor portion having such a width in the second direction that a center of the first conductor portion in the second direction is shifted from the first virtual line in the second direction.

2. The current sensor according to claim 1, wherein when the first conductor portion has the width W in the second direction,
    the pair of magnetic shield has the length L in the second direction which is at least 2×W and no greater than 5×W, and
    the first virtual line and the center of the first conductor portion are separated from each other in the second direction by a distance D greater than (W/2)×(16/32) and smaller than (W/2)×(20/32).

3. The current sensor according to claim 1, wherein when the first conductor portion has the width W in the second direction,
    the pair of magnetic shield has the length L in the second direction which is at least 2×W and no greater than 5×W, and
    the first virtual line and the center of the first conductor portion are separated from each other in the second direction by a distance D greater than (W/2)×(17/32) and smaller than (W/2)×(19/32).

4. The current sensor according to claim 1, further comprising a circuit board on which the plurality of magnetic sensors of the plurality of current detectors are mounted,
    wherein the plurality of magnetic sensors are positioned along a second virtual line parallel to the virtual plane and extending in the second direction.

5. The current sensor according to claim 4, wherein each conductor has second conductor portions extending in the first direction from both ends of the first conductor portion in the first direction, the second conductor portions having a width in the second direction greater than the width of the first conductor portion.

6. The current sensor according to claim 5, wherein:
    the plurality of conductors include three or more equally spaced conductors such that a middle conductor is disposed between two conductors, the middle conductor having a third virtual line extending in the first direction and passing a center of the width of the second conductor portions, the third virtual line intersecting the first virtual line defined for the pair of the magnetic shields in the corresponding current detector provided for the middle conductor.

7. The current sensor according to claim 6, wherein the first conductor portion and the second conductor portions extending therefrom share a common side edge linearly extending in the first direction.

8. The current sensor according to claim 5, wherein the first conductor portion is entirely positioned between the pair of magnetic shields.

* * * * *